United States Patent
Alhassan et al.

(10) Patent No.: US 11,158,760 B2
(45) Date of Patent: Oct. 26, 2021

(54) METAL ORGANIC CHEMICAL VAPOR DEPOSTION (MOCVD) TUNNEL JUNCTION GROWTH IN III-NITRIDE DEVICES

(71) Applicant: The Regents of the University of California, Oakland, CA (US)

(72) Inventors: Abdullah Ibrahim Alhassan, Goleta, CA (US); James S. Speck, Santa Barbara, CA (US); Steven P. DenBaars, Goleta, CA (US); Ahmed Alyamani, Riyadh (SA); Abdulrahman Albadri, Riyadh (SA)

(73) Assignees: The Regents of the University of California, Oakland, CA (US); KING ABDULAZIZ CITY FOR SCIENCE AND TECHNOLOGY (KACST), Riyadh (SA)

(*) Notice: Subject to any disclaimer, the term of this patent is extended or adjusted under 35 U.S.C. 154(b) by 0 days.

(21) Appl. No.: 16/270,177

(22) Filed: Feb. 7, 2019

(65) Prior Publication Data
US 2019/0245112 A1    Aug. 8, 2019

Related U.S. Application Data

(60) Provisional application No. 62/627,316, filed on Feb. 7, 2018, provisional application No. 62/627,312, filed on Feb. 7, 2018.

(51) Int. Cl.
*H01L 21/8238* (2006.01)
*H01L 29/66* (2006.01)
(Continued)

(52) U.S. Cl.
CPC ......... *H01L 33/0075* (2013.01); *C23C 16/34* (2013.01); *H01L 33/06* (2013.01); *H01L 33/325* (2013.01)

(58) Field of Classification Search
CPC .................. H01L 29/66151; H01L 33/0075
(Continued)

(56) References Cited

U.S. PATENT DOCUMENTS

| 6,274,892 B1 * | 8/2001 | Kub ................. H01L 21/187 257/131 |
| 6,780,725 B2 * | 8/2004 | Fujimaki ......... H01L 21/82285 257/E21.375 |

(Continued)

OTHER PUBLICATIONS

Kuwano et al., "Lateral Hydrogen Diffusion at p-GaN Layers in Nitride-Based Light Emitting Diodes with Tunnel Junctions Lateral Hydrogen Diffusion at p-GaN Layers in Nitride-Based Light Emitting Diodes with Tunnel Junctions," Jpn. J. Appl. Phys., vol. 12, pp. 8-11, 2013.

(Continued)

*Primary Examiner* — Calvin Lee
(74) *Attorney, Agent, or Firm* — Gates & Cooper LLP

(57) ABSTRACT

A method for fabricating an (Al,Ga,In,B)N or III-nitride semiconductor device, including performing a growth of III-nitride or (Al,Ga,In,B)N material including a p-n junction with an active region and using metal-organic chemical vapor deposition (MOCVD) or chemical vapor deposition; and performing a subsequent regrowth of n-type (Al,Ga,In,B)N or III-nitride material using MOCVD or chemical vapor deposition while utilizing a pulsed delta n-type doping scheme to realize an abrupt, smoother surface of the n-type material and a higher carrier concentration in the n-type material. In another example, the method comprises forming a mesa having a top surface; and activating magnesium in the p-type GaN of the (Al,Ga,In,B)N material through openings in the top surface that expose the p-type GaN's surface. The openings are formed before or after the subsequent regrowth of the tunnel junction.

21 Claims, 14 Drawing Sheets

(51) Int. Cl.
  *H01L 33/00* (2010.01)
  *H01L 33/06* (2010.01)
  *H01L 33/32* (2010.01)
  *C23C 16/34* (2006.01)

(58) Field of Classification Search
  USPC ..... 438/47, 220, 380, 979; 257/46, 104, 495
  See application file for complete search history.

(56) References Cited

U.S. PATENT DOCUMENTS 7,732,835 B2 * 6/2010 Voegeli ............... H01L 21/8249
  257/183
2016/0268181 A1 * 9/2016 Yasuhara ................ H01L 29/51

OTHER PUBLICATIONS

Nakamura et al., "Hole Compensation Mechanism of P-Type GaN Films," Jpn. J. Appl. Phys., vol. 31, No. Part 1, No. 5A, pp. 1258-1266, May 1992.

Ohba, et al., "A study on strong memory effects for Mg doping in GaN metalorganic chemical vapor deposition," Elsevier J. Cryst. Growth, vol. 145, pp. 214-218, 1994.

Seong-Ran et al., "Lateral current spreading in GaN-based light-emitting diodes utilizing tunnel contact junctions," Appl. Phys. Lett., vol. 78, No. 21, pp. 3265-3267, 2001.

Stringfellow, "Overview of the OMVPE Process," in Organometallic Vapor-Phase Epitaxy, 2nd ed., San Diego: Elsevier, 1999, pp. 1-16.

Takeuchi et al., "GaN-based light emitting diodes with tunnel junctions," Japanese J. Appl. Phys. / Part2, vol. 40, No. 8B, pp. L861-L863, 2001.

Xing et al., "Memory Effect and Redistribution of Mg into Sequentially Regrown GaN Layer by Metalorganic Chemical Vapor Deposition," Jpn. J. Appl. Phys., vol. 42, No. Part 1, No. 1, pp. 50-53, Jan. 2003.

Yonkee et al., "Demonstration of a III-nitride edge-emitting laser diode utilizing a GaN tunnel junction contact," Opt. Express, vol. 24, No. 7, 7 pages, Apr. 2016.

Yonkee et al., "Demonstration of low resistance ohmic contacts to p-type (2021) GaN," Semicond. Sci. Technol., vol. 30, No. 7, p. 1-5, 2015.

Young et al., "Hybrid tunnel junction contacts to III-nitride light-emitting diodes," Appl. Phys. Express, vol. 9, No. 2, p. 22102-1 to 22102-4, Feb. 2016.

* cited by examiner

METAL ORGANIC CHEMICAL VAPOR DEPOSTION (MOCVD) TUNNEL JUNCTION GROWTH IN III-NITRIDE DEVICES

CROSS REFERENCE TO RELATED APPLICATIONS

This application claims the benefit under 35 U.S.C. Section 119(e) of the following commonly-assigned U.S. applications:

U.S. Provisional Patent Application No. 62/627,316, filed Feb. 7, 2018, by Abdullah Ibrahim Alhassan and Steven P DenBaars, entitled "DELTA DOPING FOR MOCVD TUNNEL JUNCTION GROWTH IN III-NITRIDE DEVICES," and U.S. Provisional Patent Application No. 62/627,312, filed Feb. 7, 2018, by Abdullah Ibrahim Alhassan and Steven P DenBaars, entitled "REALIZATION OF MOCVD TUNNEL JUNCTION CONTACTS IN LARGE AREA III-NITRIDE DEVICES,"

both of which applications are incorporated by reference herein.

BACKGROUND OF THE INVENTION

1. Field of the Invention

The present invention relates to a method of fabricating tunnel junction devices.

2. Description of the Related Art

III-nitride LEDs are a commercially proven technology and high efficiency industry LEDs have been demonstrated on a variety of substrates. All commercial light emitting devices utilize traditional p-contacts and materials other than p-GaN for current spreading, which typically comprise transparent conducting oxides (TCO), such as indium tin oxide (ITO) or Zinc Oxide ($ZO_2$). Although these materials are standard TCO for LEDs and widely used, they suffer from high optical losses which limits the performance of III-nitride based optoelectronics devices. A tunnel junction is a diode comprising a very highly doped ($n^+/p^+$) interface that allows for electrons to tunnel between the valence band and conduction band. N-type GaN (n-GaN) can be used as a current spreading layer on both sides of the device, eliminating the need for a TCO layer or a silver (Ag) mirror. Improving the $n^+$-GaN layer at the tunnel junction interface could improve the efficiency and reliability of III-nitride optoelectronics devices utilizing a tunnel junction. Since Metal Organic Chemical Vapor (MOCVD) tools are commonly used in semiconductor processing on an industrial scale, this method of forming III-nitride tunnel junctions can be readily commercialized.

However, tunnel junctions grown by MOCVD are difficult to achieve because the grown Mg-doped III-N layers are extremely resistive due to hydrogen passivation, and are typically activated by a post growth anneal. Additionally, it is hard to produce well defined junctions, because of a phenomenon known as the Mg memory effect and the moderate n-type layer doping.

What is needed then, are methods of improving the performance of tunnel junction performance. The present invention satisfies this need.

SUMMARY OF THE INVENTION

The present disclosure describes a structure for improving the performance and reliability of III-nitride based tunnel junction optoelectronic devices.

In one example, after the growth of the LED structure, the p-GaN can be activated either in situ or ex situ before or after the tunnel junction regrowth. After that, an additional MOCVD growth is used to grow a tunnel junction on large III-nitride devices. After etching a mesa structure in which one or more lateral dimensions are on the order of or larger than 50 μm, any p-GaN that may be re-passivated by hydrogen at elevated temperatures can be reactivated by annealing through the side wall or top surface through diffusion of hydrogen. By combining MOCVD grown light emitters or absorbers and additional MOCVD deposited tunnel junction layer(s), the operating voltage of these devices can be reduced and their efficiency can be increased, and new types of device structures are enabled.

In another example, after the growth of the light emitting structure (e.g., light emitting diode (LED)), the p-GaN can be activated either in situ or ex situ before or after the tunnel junction regrowth. After that, an additional MOCVD growth is used to grow a tunnel junction on large III-nitride devices using two methods. In a first method, a selective area tunnel junction regrowth is performed on p-GaN with a dielectric pattern which will be etched later for post activation. After etching a mesa structure in which one or more lateral dimensions are on the order of, or larger than, 50 μm, any p-GaN that may be re-passivated by hydrogen at elevated temperatures can be reactivated by annealing through the side wall and top surface diffusion of hydrogen. In a second method, a tunnel junction regrowth is performed by MOCVD so as to cover the entire p-GaN surface. Then, a mesa is etched in the device, followed by etching small openings through the n-GaN tunnel junction to expose the p-GaN, to allow for a complete p-GaN activation by annealing through the side wall and top surface diffusion of hydrogen. An exposed buried p-GaN, even with small opening(s), leads to a full activation of p-GaN after annealing.

By combining MOCVD grown light emitters or absorbers and an additional MOCVD deposited tunnel junction layer, the operating voltage of the devices could be reduced and their efficiency could be increased. Moreover, the present invention enables new types of device structures, including new types of light-emitting diodes (LEDs), power electronics devices, edge-emitting laser diodes (EELDs), and solar cells.

Embodiments of the present invention include, but are not limited to, the following.

1. A device, comprising a mesa including a III-nitride p-n junction, the p-n junction including an active region between a first p-type layer and a first n-type layer; a III-nitride region patterned on the III-nitride p-n junction, the III-nitride region including a second n-type layer, a second p-type layer, and a tunnel junction formed at an interface between the second n-type layer and the second p-type layer; and an array of openings in the III-nitride region exposing the second p-type layer on a top surface of the mesa; and wherein the mesa has one or more lateral dimensions that are larger than 50 micrometers (m).

2. The device of embodiment 1, wherein each of the openings have a width W and 0.1 μm≤W≤100 μm.

3. The device of embodiment 1 or 2, wherein a spacing S between the openings is 0.5 μm≤S≤400 μm.

4. The device of one or any combination of embodiments 1-3, further comprising a patterned dielectric on a top surface of the mesa, wherein the patterned dielectric comprises the openings exposing the second p-type layer.

5. The device of one or any combination of embodiments 1-4, wherein the first p-type layer, the second p-type layer, the first n-type layer, and the second n-type layer comprise GaN.

6. The device of one or any combination of embodiments 1-5, wherein the second n-type layer comprises an n-type GaN layer having an n-type dopant concentration of at least $1.1E20$ $cm^{-3}$.

7. The device of one or any combination of embodiments 1-6, wherein the interface has a surface roughness of 2.2 nanometers (nm) or less over an area of 5 micrometers by 5 micrometers.

8. The device of one or any combination of embodiments 1-7, wherein a current density of at least 5 $A/cm^2$ flows in response to a voltage of 2.5 V applied across the device between a first metal contact to the first n-type layer and a second metal contact to the second n-type layer, and the device outputs light with a power of at least 0.5 milliwatts (mW) in response to a current density of 2.25 $A/cm^2$ flowing between the first metal contact and the second metal contact.

9. A method for fabricating a III-nitride semiconductor device, comprising growing a III-nitride p-n junction with an active region and using metal-organic chemical vapor deposition (MOCVD) or chemical vapor deposition, the III-nitride p-n junction including the active region between a p-type layer and an n-type layer; and growing subsequent III-nitride material including an n-type material using MOCVD or chemical vapor deposition, utilizing a pulsed delta n-type doping scheme to realize an abrupt, smoother surface of the n-type material and a higher carrier concentration in the n-type material; and wherein the subsequent III-nitride material forms a tunnel junction.

10. The method of embodiment 9, wherein a pulsed delta n-type doping scheme is used at a regrowth interface with the p-n junction or for the entire growth of the subsequent III-nitride material including the tunnel junction.

11. The method of embodiments 9 or 10, wherein the pulsed delta n-type doping scheme is achieved by injecting a precursor containing n-type dopant for 40 seconds or less per cycle and forms a continuous layer growth by keeping the Group V and Group III precursors uninterrupted.

12. The method of one or any combination of embodiments 9-11, wherein the pulsed delta n-type doping scheme is achieved by injecting precursors containing n-type dopant and Group V/III materials for a period of time in cycles.

13. A method for fabricating a semiconductor device, comprising:
growing a III-nitride p-n junction with an active region using metal-organic chemical vapor deposition (MOCVD) and/or chemical vapor deposition (CVD), wherein the III-nitride p-n junction includes a first p-type layer, a first n-type layer, and the active region between the first n-type layer and the first p-type layer; growing a subsequent III-nitride material comprising a second p-type layer using MOCVD or chemical vapor deposition (CVD); forming a mesa in the III-nitride p-n junction and the subsequent III-nitride material, wherein the mesa has one or more lateral dimensions that are larger than 50 µm; and reactivating or activating a second p-type layer in the subsequent III-nitride material through lateral and vertical diffusion of hydrogen through the mesa's sidewalls and top surface; and wherein the subsequent III-nitride material forms a tunnel junction.

14. The method of embodiment 13, wherein the first n-type layer in the p-n junction and the active region are grown using the MOCVD, and the first p-type layer, the second p-type layer, and the tunnel junction are grown using the CVD.

15. The method of embodiments 13 or 14, wherein delta-doping is used at a regrowth interface between the III-nitride p-n junction and the subsequent III-nitride material.

16. The method of one or any combination of embodiments 13-15, wherein the subsequent III-nitride material forms layers of the III-nitride material and a magnesium (Mg) concentration in the layers of the III-nitride material is suppressed through exposure to an acid or through flow modulation epitaxy.

17. The method of one or any combination of embodiments 13-16, wherein the reactivating or the activating activates Mg through the lateral and vertical diffusion of hydrogen through the sidewalls and the top surface at elevated temperatures above 800 degrees Celsius.

18. The method of one or any combination of embodiments 13-18, wherein the activating or the reactivating through the top surface occurs through openings that expose a surface of the second p-type layer comprising a p-type GaN layer.

19. The method of embodiment 18, wherein a width of the openings is between about 0.1 µm to about 100 µm wide and a spacing between each of the openings is about 0.5 µm to about 400 µm.

20. The method of embodiments 18 or 19, wherein the first p-type layer and the second p-type layer comprise p-GaN and the openings are formed before the subsequent III-nitride material including the tunnel junction by first depositing a pattern of a dielectric on a surface of the first p-GaN layer such that the subsequent III-nitride material occurs selectively only on the exposed area of the first p-type layer.

21. One or any combination of embodiments 9-12 in combination with one or any combination of embodiments 13-20.

22. The device of one or any combination of embodiments 1-8 fabricated using the method of one or any combination of embodiments 9-20.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

A. First Embodiment: Delta Doping for MOCVD Tunnel Junction Growth in III-Nitride Devices 1. Introduction Metal-organic chemical vapor deposition (MOCVD), also referred to as organometallic vapor phase epitaxy (OMVPE) is a type of chemical vapor deposition (CVD) method used to form thin films of various materials and microstructures. This is achieved by flowing volatile organometallic gaseous precursors over a homoepitaxial or heteroepitaxial substrate at elevated temperatures, leading to the growth of high quality (e.g., single) crystal films of various compound semiconductors.

N-type doping in III-nitride materials can be accomplished by incorporating atoms that act as electron donors, i.e. they have an energy level that sits very close to the conduction band of the host material. To date, optoelectronic devices such as LEDs and LDs have been fabricated with silicon (Si) semiconductor materials. However, heavy Si doping leads to dislocation inclines, resulting in a buildup of tensile stress that can lead to morphological degradation. One strategy to improve the highly doped n-type layer is performing a delta doping instead of continuous n-type doping.

Implementing delta n-type doping during the tunnel junction growth can reduce the surface roughness of the layer, leading to a uniform field across the tunnel junction interface and uniform current injection. Additionally, optimizing the delta doping growth conditions can result in higher doping as compared to continuous doping with the same carrier flows.

2. Example Doping Schemes

Figure 1A:
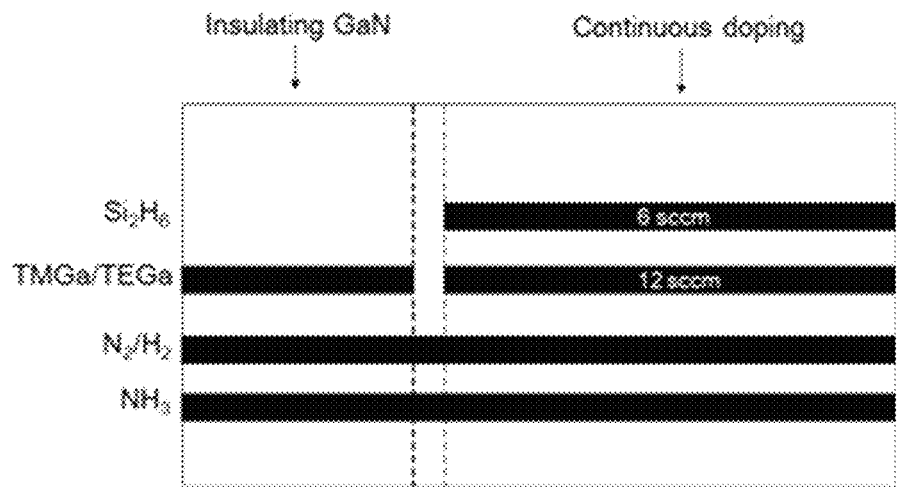
FIGS. 1A-1C show schematic diagrams of the various doping schemes, for continuous n-type doping (FIG. 1A), delta n-type doping by pulsing the dopant source during growth of a continuous layer (FIG. 1B), and delta n-type doping by pulsing the dopant source while pulsing III-N sources (FIG. 1C).
Figure 1B:
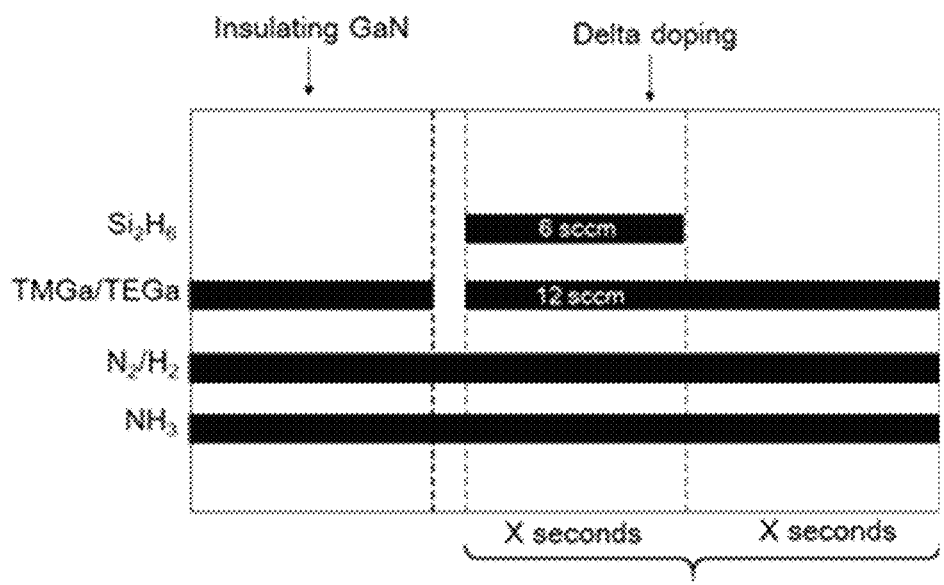
Figure 1C:
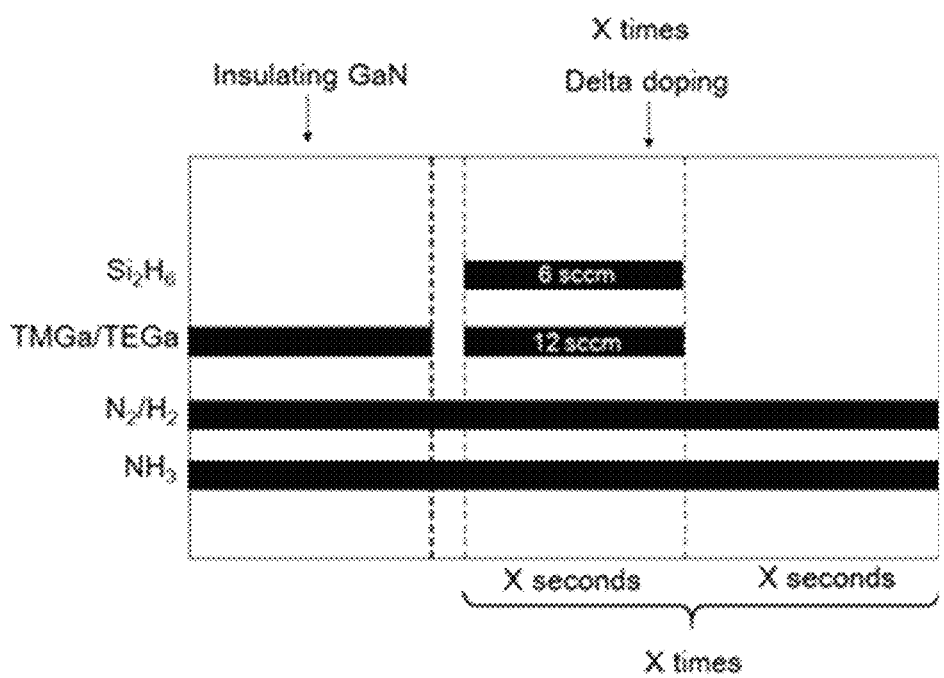

FIGS. 1A-1C are schematic diagrams illustrating the various doping schemes, showing a continuous n-type doping during a continuous layer growth (e.g., GaN) (FIG. 1A), delta n-type doping by pulsing the dopant source (e.g., Si) during a continuous layer growth (FIG. 1B), and delta n-type doping by pulsing the dopant source during a pulsed deposition from pulsed III-N sources (FIG. 1C).

During the continuous n-type GaN:Si growth, a precursor containing Ga (trimethyl gallium [TMGa] or triethyl gallium [TEGa]), a precursor containing N ($NH_3$), and a precursor containing Si(silane or disilane) are injected into the reactor chamber at the same time. These precursor gasses are mixed with $H_2$ and/or $N_2$ carrier gas and directed to flow over the substrate material, which is heated to between 500° C. and 1200° C. during growth. The concentration of Si in the GaN:Si film increases with an increasing molar flow ratio of Si to Ga. On the other hand, during delta doping (FIG. 1B), the precursor containing Si is injected for a short time in a cycle. Lastly, in FIG. 1C, both the V/III sources and the Si source are injected into the chamber for a short time in a cycle.

Figure 2:
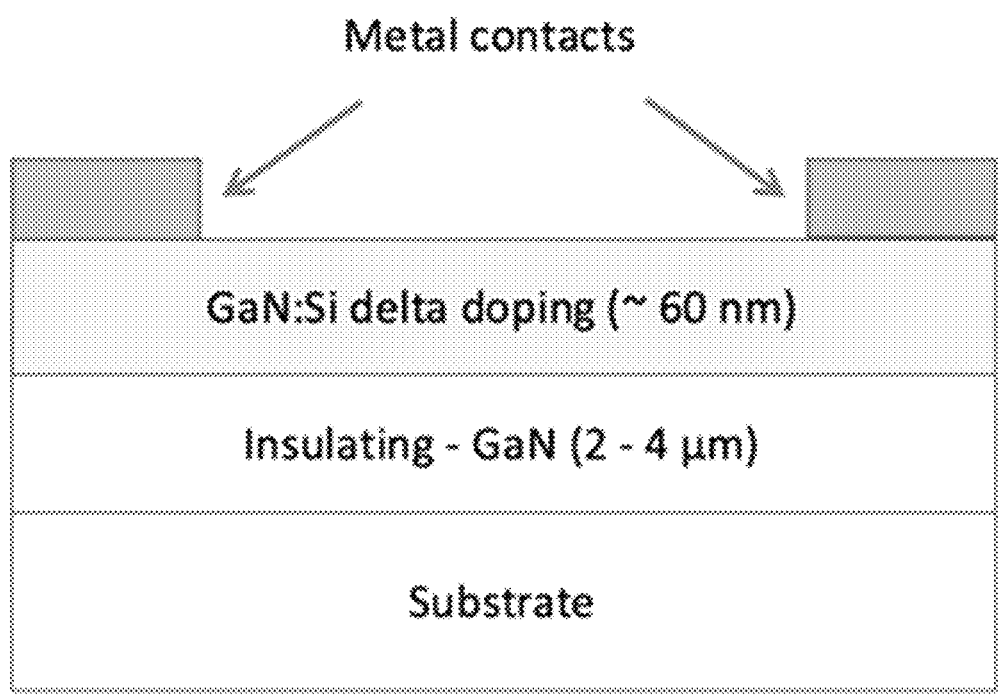
FIG. 2. Epitaxial structure grown by MOCVD for the Hall Effect measurements.

FIG. 2 shows an epitaxial structure grown by MOCVD used to characterize GaN:Si layers electrically via Hall effect measurements. Hall Effect measurements were performed using indium contacts in a Van-der-Pauw geometry.

FIGS. 3-6 illustrate results demonstrating working examples of the present invention.

Figure 3:
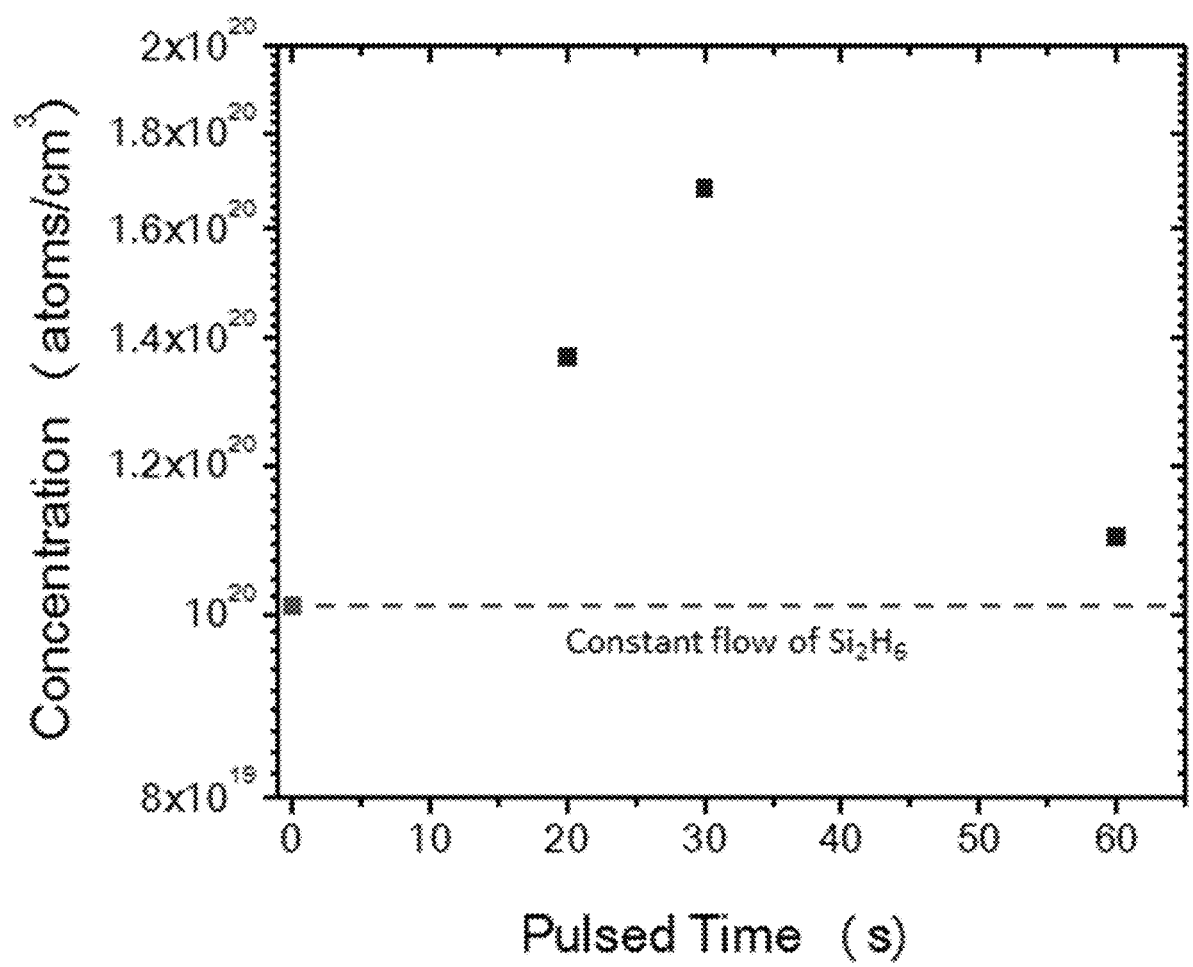
FIG. 3. Measured carrier concentration from Hall measurements for GaN:Si layers fabricated by varying the pulse doping time while maintaining the same flow and growth rate.

FIG. 3 shows the measured carrier concentration from Hall measurements for delta doped GaN:Si layers as a function of the delta doping time while maintaining the same flow and growth rate. Si was introduced with a constant flow of both $Si_2H_6$ and TMGa or TEGa in order to achieve a continuously doped layer. For example, a $Si_2H_6$ flow rate of 6 sccm with a TEGa flow rate of 12 resulted in carrier concentrations (assumed equal to Si concentrations due to low activation energy) around $1.06E20$ $cm^3$. Si can also be introduced via a pulsed flow of $Si_2H_6$, where the Ga containing carrier gas flow remains uninterrupted. This pulsed doping scheme allows the incorporation of high concentrations of Si while maintaining a smooth surface morphology. Alternating doped and undoped layers (growing time while doping and growing time without doping in a range of 20 to 60 seconds) with an $Si_2H_6$ flow of 6 sccm and a continuous TEGa flow of 12 sccm for 60 nm total thickness resulted in a carrier concentration ranging from $1.1E20$ $cm^3$ to $1.7E20$ $cm^{-3}$. All the pulsed GaN:Si layers exhibited higher carrier concentration as compared to when using continuous flow.

Figure 4B:
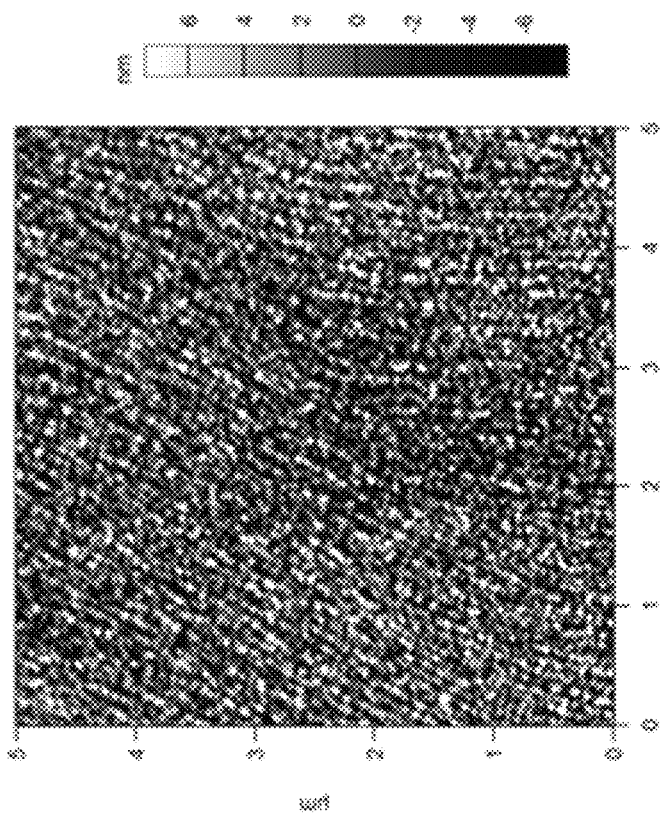
FIGS. 4A-4B. Atomic force microscopy (AFM) images of a continuously doped GaN:Si layer (FIG. 4A) and a delta doped GaN:Si layer (FIG. 4B).
Figure 4A:
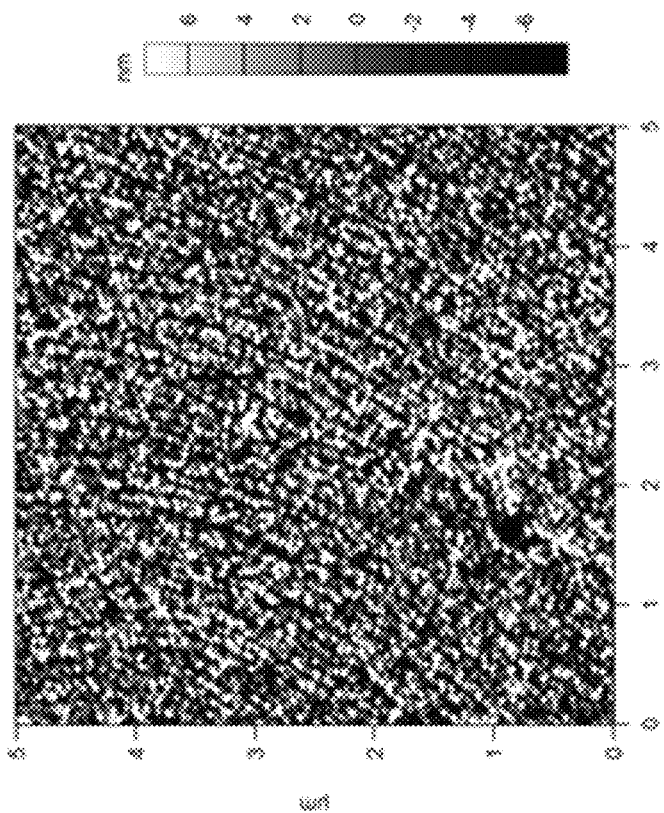

FIG. 4 shows an atomic force microscopy (AFM) image of a continuously doped GaN:Si layer (FIG. 4A), and a delta doped GaN:Si layer (FIG. 4B). Alternating 30 second doped and 30 second undoped layers with the same carrier flows for 10 nm total thickness resulted in a higher carrier concentration and smoother surfaces, which should result in better electrical characteristics for the tunnel junction formed using pulsed doped GaN:Si layers. The root-mean-squared (RMS) roughness was 2.2 nm and 5.3 nm for the samples grown with a pulsed GaN:Si layer and a continuous GaN:Si layer, respectively.

Figure 5:
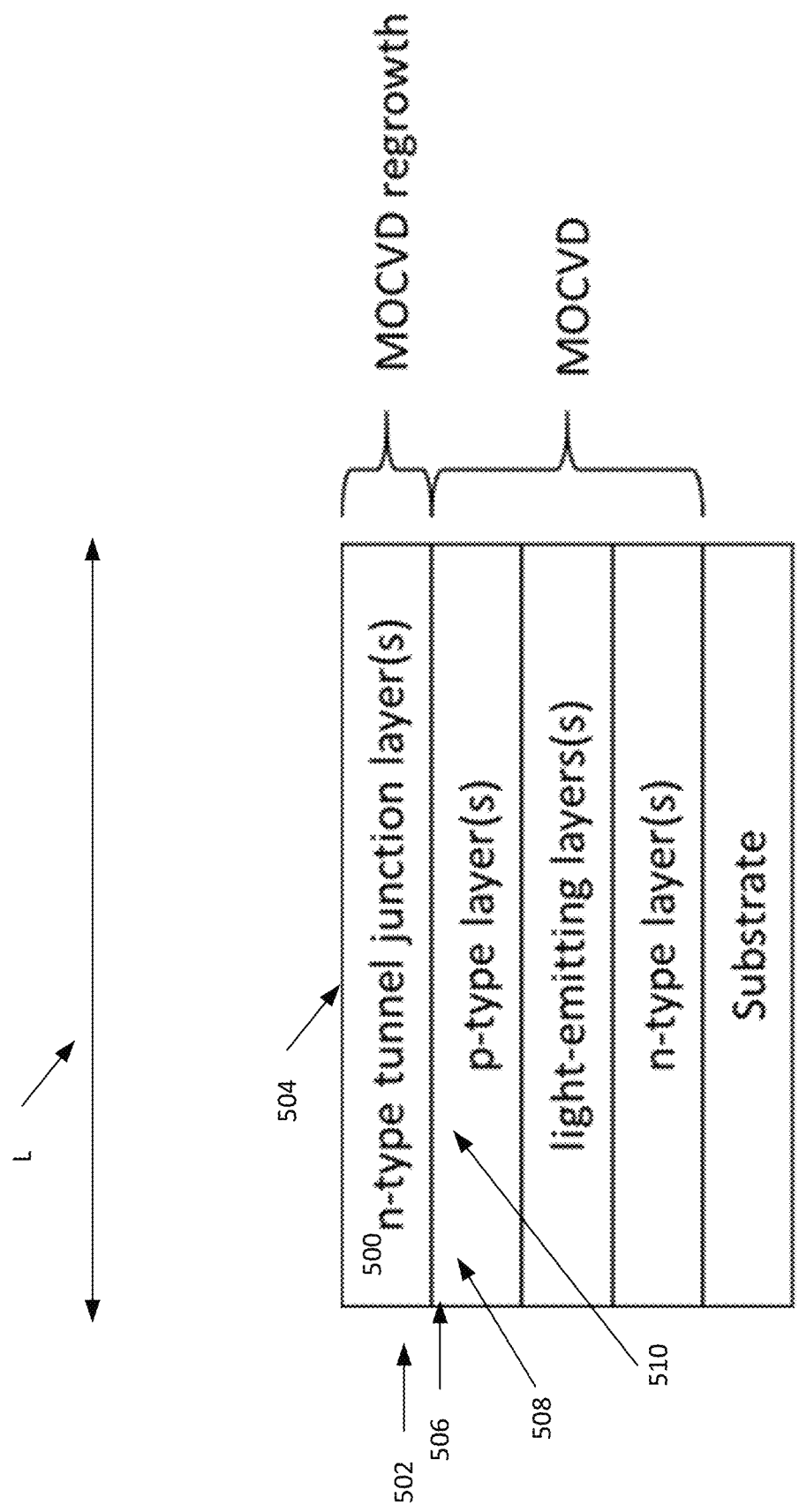
FIG. 5. is a schematic of an epitaxial structure for a MOCVD deposited tunnel junction grown on an MOCVD LED.

FIG. 5 is a schematic of an epitaxial structure for a MOCVD deposited tunnel junction grown on an MOCVD LED. Delta doping was used to grow the heavily doped n-type layer to form a tunnel junction.

Figure 6:
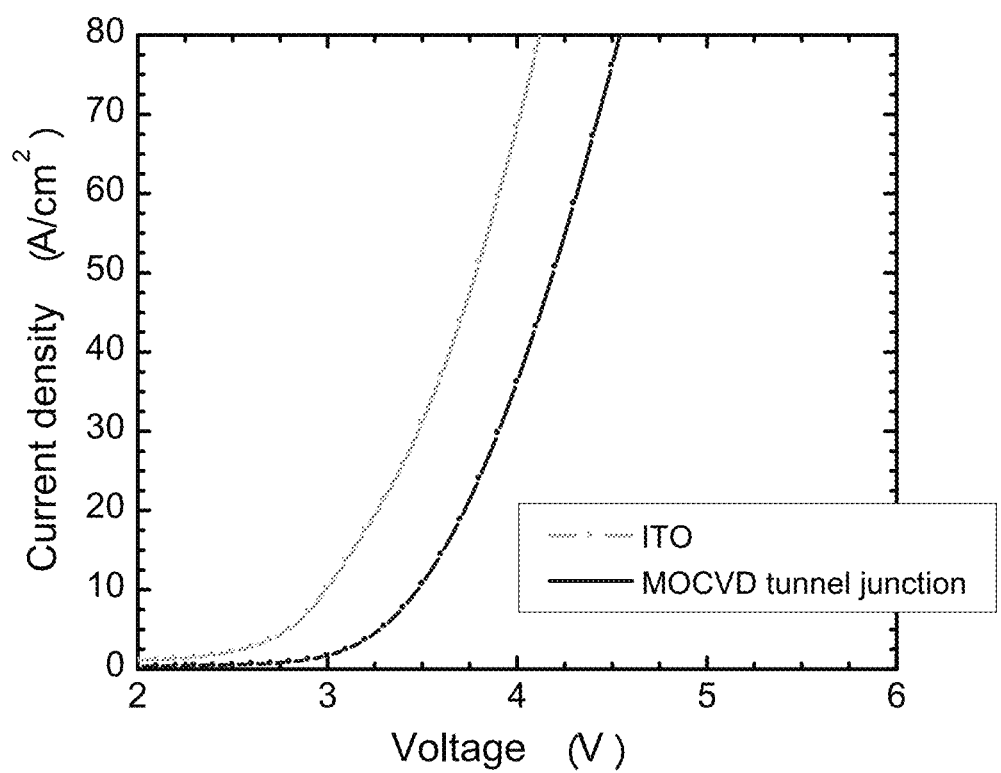
FIG. 6. The current voltage (I-V) measurement of tunnel junction compared to an ITO LED.

FIG. 6 illustrates the current voltage (I-V) measurement of the tunnel junction compared to an ITO LED with an activation condition of 700° C. for 15 min. At 20 A/cm$^2$, the difference between ITO and tunnel junction LEDs is around only 0.4 V.

3. Process Steps

Figure 7:
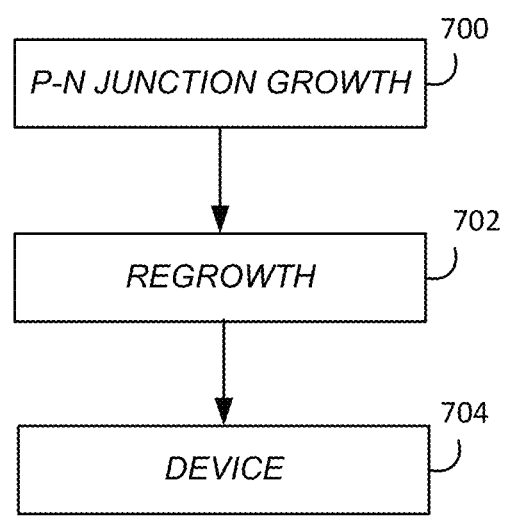
FIG. 7 is a flowchart illustrating a method of fabricating a device according to the first embodiment.

FIG. 7 is a flowchart illustrating a method for fabricating an (Al,Ga,In,B)N semiconductor device (referring also to FIG. 5).

Block 700 represents performing a growth of/growing a III-nitride p-n junction with an active region using metal-organic chemical vapor deposition (MOCVD) and/or chemical vapor deposition. The growth could be on homoepitaxial or heteroepitaxial substrate. The substrate used could be III-nitride native substrate such as GaN, AlN and InN or foreign substrate such as sapphire, silicon carbide and silicon. The III-nitride p-n junction includes the active region between a p-type layer and an n-type layer.

Block 702 represents performing a subsequent growth or regrowth 502 of (Al,Ga,In,B)N or III-nitride materials 502 using MOCVD, utilizing a delta (pulsed) n-type doping scheme to realize abrupt, smoother surface and higher carrier concentation n-type layer 500 (see FIG. 5). Examples of dopants include, but are not limited to, silicon (Si) and germanium (Ge).

In one or more embodiments, the subsequent III-nitride material 502 forms a tunnel junction.

In one or more embodiments, the subsequent regrowth ends with an n-type material 504 between about 1 nm to about 5000 nm thick.

In one or more embodiments, the subsequent regrowth includes n-type 500 and p-type material 508, and the tunnel junction 510 is formed at a regrowth interface 506 of the n-type and p-type material.

In one or more embodiments, delta-doping is used at the regrowth interface 506 or for the entire subsequent tunnel junction regrowth or entire growth of the subsequent III-nitride material 502 including the tunnel junction 510.

In one or more embodiments, the pulsed delta n-type doping scheme is achieved by injecting the precursor containing n-type dopant for a short time (e.g., 40 seconds or less) in cycles and forming continuous layer growth by keeping the precursors comprising Group V and Group III precursors uninterrupted.

In one or more embodiments, the delta doping scheme is achieved by injecting both the precursors containing n-type dopant and V/III precursors for a short time (e.g., 40 seconds or less) in cycles.

Block 704 represents the end result, a device such as, but not limited to, a light emitting diode, a vertical cavity surface emitting laser, (VCSEL), a laser diode, a solar cell, or a photodetector.

In one or more embodiments, the device size has one or more lateral dimensions L that are larger than 5 μm.

The III-nitride materials can include various polarities of (Ga,Al,In,B)N, such as Ga-polar, N-polar, semi-polar or non-polar. In particular, N-face material may be obtained from N-polar or semi-polar Gallium Nitride (GaN).

In one or more examples, only an n-type layer and the first active region are grown using MOCVD, and a p-type region and the tunnel junction are grown by a technique involving chemical vapor deposition.

4. Advantages and Improvements

Tunnel junctions are formed when semiconductor p-n junctions are doped heavily enough such that carriers can tunnel between the conduction and valence bands. Magnesium (Mg) is most suitable p-type dopant in the III-N semiconductors and very high p-type doping can be achieved without degrading the surface quality. However, there are issues with highly n-doped layers as an n-type layer with concentrations above $10^{19}$ cm$^{-3}$. Heavy n-type doping in III-N leads to dislocation inclines, resulting in a buildup of tensile stress that can lead to morphological degradation. This will limit the doping concentration in the n$^+$-GaN at the tunnel junction interface, resulting in a reduced carrier tunneling efficiency.

As illustrated herein, the implementation of n-type (e.g., Si) delta doping instead of continuously Si doping in the heavily n$^+$-GaN layer allows for an improved surface morphology, leading to a uniform field across the tunnel junction interface. Furthermore, higher Si concentration can be achieved using delta Si doping compared to continuous doping with the same carrier flow rate. Lastly, increasing the doping in the n-type layer reduces the barrier for interband tunneling distance and reduce the forward voltage in the devices.

B. Second Embodiment: Realization of MOCVD Tunnel Junction Contacts in Large Area III-Nitride Devices 1. Introduction This section describes a regrowth method for large III-nitride (III-N) tunnel junction devices that uses MOCVD to grow light-emitting and/or light-absorbing structures and MOCVD regrowth to grow tunnel junctions.

P-type GaN is a highly resistive material formed by doping GaN films with Mg.

Since MOCVD reactions take place at elevated temperatures in the presence of hydrogen gas, charge carrying holes become compensated by the presence of hydrogen-magnesium complexes. In order to activate the holes, these complexes must be dissociated through a high temperature anneal [4]. In addition, carrier concentrations are only a few percent relative to dopant concentrations due to the high activation energy of Mg relative to the valence band edge of III-nitrides. The relatively low hole concentrations make forming low resistance ohmic contacts to p-GaN challenging. N-type doped transparent conductive oxides (TCO) are typically used to make contact to p-GaN. They form a tunnel junction contact to p-GaN and inject holes from the conduction band of the n-type material into the valence band of p-GaN. Homojunctions can also be used to tunnel carriers into p-GaN. This has been successfully demonstrated through the use of Molecular Beam Epitaxy (MBE) regrowth of highly doped n-GaN onto p-GaN [5]-[7].

MOCVD regrowth of n-type GaN is more of a challenge since the p-GaN surface can become re-passivated by the presence of H$_2$ at elevated temperatures. Although some examples of in situ MOCVD grown tunnel junctions exist for LEDs [8], [9], their turn on voltage and series resistance are higher than those of their reference devices. This is likely due to issues with controlling the p$^+$/n$^+$ junction interface and issues activating the Mg in the p-GaN layer.

2. Example Tunnel Junction Regrowth Method

The present invention provides an entire MOCVD growth method for large III-N based tunnel junction devices where the tunnel junction can be patterned during or after the growth. Two methods are disclosed to help realize effective p-GaN activation, resulting in successful tunnel junction devices by MOCVD.

Figure 8A:
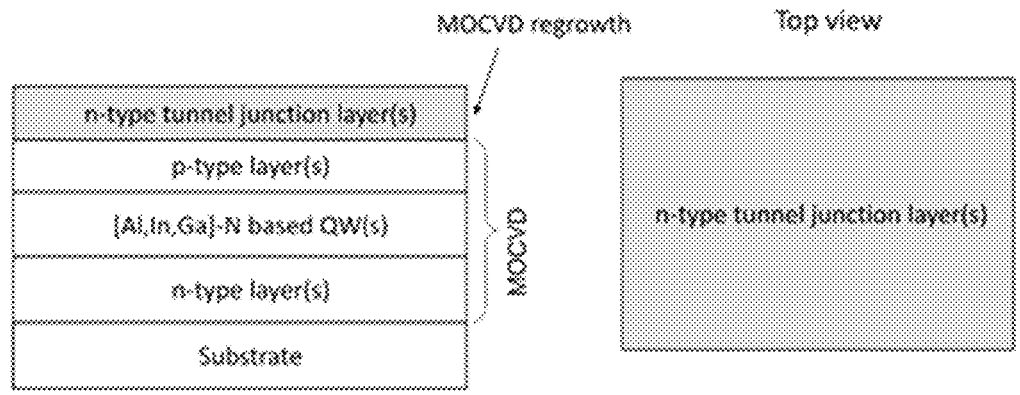
FIGS. 8A-8B. Cross-sectional schematics of device structures fabricated using method 1, showing after the deposition of MOCVD tunnel junction (FIG. 8A), and after etching the tunnel junction pattern to expose the p-GaN surface (FIG. 8B).
Figure 8B:
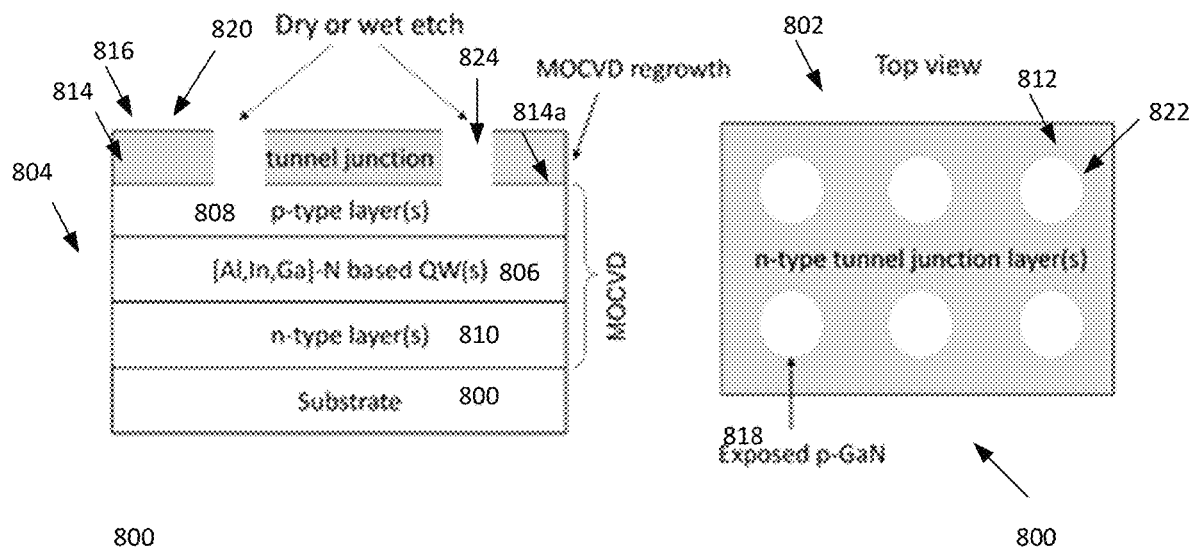

FIGS. 8A and 8B schematically show possible epitaxial structures, growth methods and fabrication sequences according to a first method. In the design, the structure includes a substrate, followed by n-type layers(s), light-emitting or absorbing layer(s), and p-type layer(s) grown by MOCVD, which are followed by an n-type tunnel junction layer grown by MOCVD. After etching the mesa structure in which one or more lateral dimensions are on the order of or larger than 50 μm (FIG. 8A), a pattern having any shape and having a size of a few microns is etched until the p-GaN surface is exposed. The pattern features could have any geometric shape and could be separated with different spacings. A post growth anneal is performed to activate the buried p-GaN through the lateral and vertical diffusion of hydrogen.

Figure 9A:
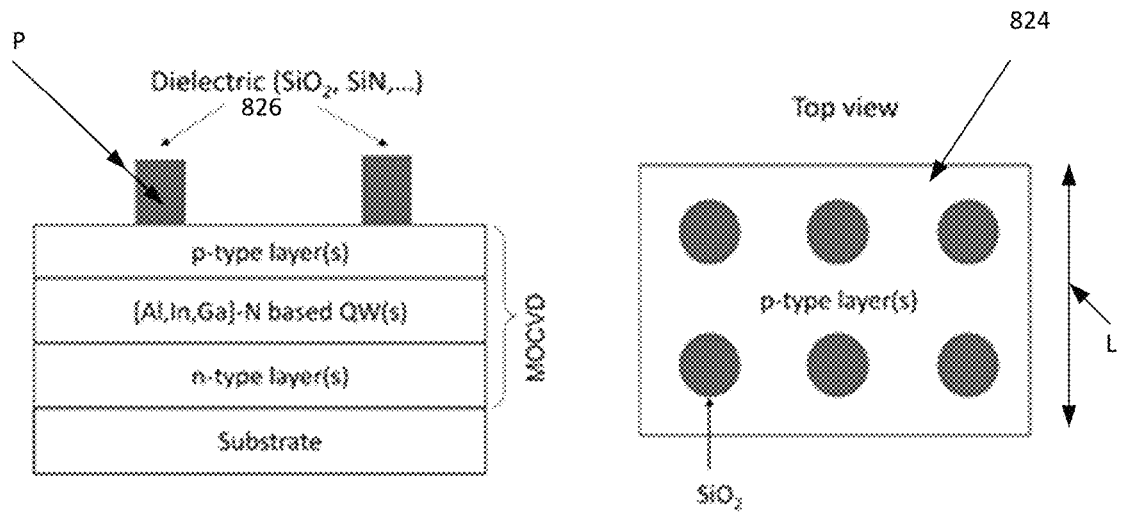
FIGS. 9A-9C. Cross-sectional schematics of device structures fabricated using method 2, showing deposition of a dielectric micro structure on the p-GaN surface (FIG. 9A), a selective area regrowth of a tunnel junction by MOCVD (FIG. 9B), and LEDs utilizing a patterned tunnel junction (FIG. 9C).
Figure 9B:
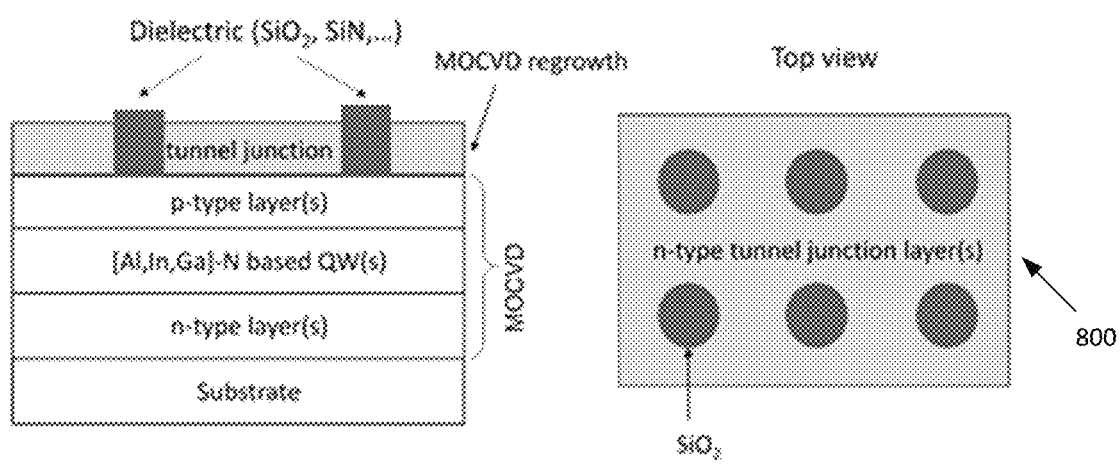
Figure 9C:
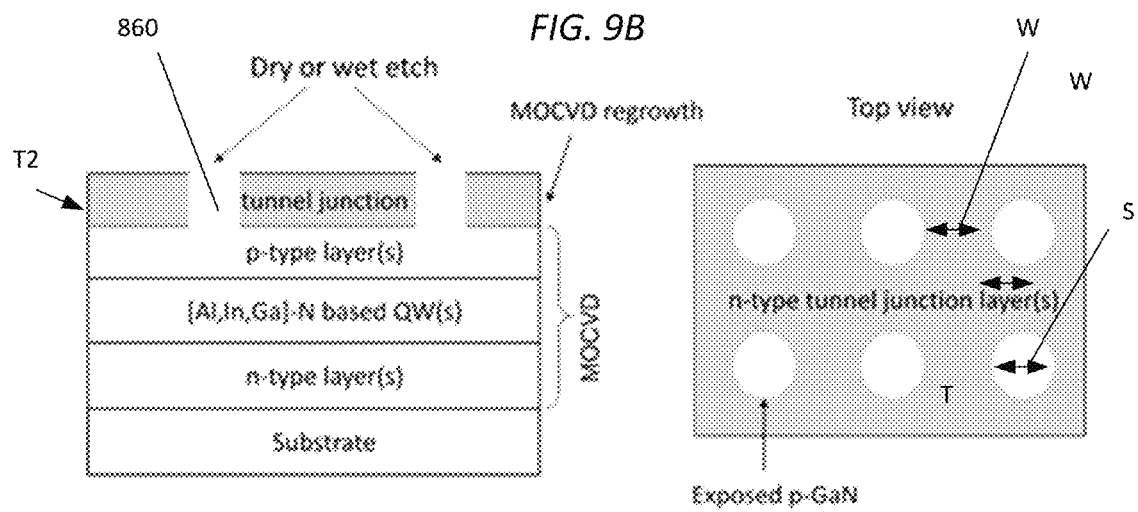

In a second method, after the growth of the device structure (stopped at p-GaN), a pattern of a dielectric is deposited on the surface of the p-GaN, as shown in FIG. 9A. Then, a selective area regrowth of a tunnel junction by MOCVD is performed. After etching the mesa structure, a post anneal is carried out to activate the p-GaN through the lateral and vertical diffusion of hydrogen.

Both methods can lead to a fully activated p-GaN as well as realize a tunnel junction by MOCVD for large area devices.

Thus, FIGS. 8A-8B and 9A-9C illustrate a device 800 (optoelectronic device, laser diode, Vertical Cavity Surface Emitting Laser (VCSEL), solar cell, photodetector, or LED) comprising a mesa 802, the mesa including a III-nitride p-n junction 804 and a III-nitride region 812 patterned on the III-nitride p-n junction 804. The III-nitride p-n junction includes an active region 806 between a first p-type layer 808 and a first n-type layer 810. The III-nitride region 812 includes a second n-type layer 816, a second p-type layer 818 on the first p-type layer 808, and a tunnel junction 820 formed at an interface 814, 814a between the second n-type layer 816 and the second p-type layer 818 or the p-n junction. The device further comprises an array 822 of openings 824 in the III-nitride region 812 exposing the second p-type layer 818. The mesa 802 has one or more lateral dimensions L that are larger than 50 μm. Light is emitted through the openings in response to a voltage applied between the first and second n-type regions.

In one or more examples, each of the openings 824 have a width W and 0.1 μm≤W≤100 μm and/or a spacing S between the openings is 0.5 μm≤S≤400 μm. In one or more examples, the openings are distributed evenly across the top surface T of the mesa.

FIG. 9A illustrates an example including a patterned dielectric 826 on a top surface 824 of the mesa, wherein the patterned dielectric comprises the openings 824 exposing the second p-type layer 818.

In one or more examples, the first p-type layer, the second p-type layer, the first n-type layer, and the second n-type layer comprise GaN.

In one or more examples, the second n-type layer comprises an n-type GaN layer having an n-type dopant concentration of at least $1.1E20$ $cm^{-3}$.

In one or more examples, the interface has a surface roughness of 2.2 nm or less over an area of 5 micrometers by 5 micrometers.

FIGS. 10A-10B, 11A-11B, 12, and 13A-13C illustrate results demonstrating working examples of the present invention.

Figure 10B:
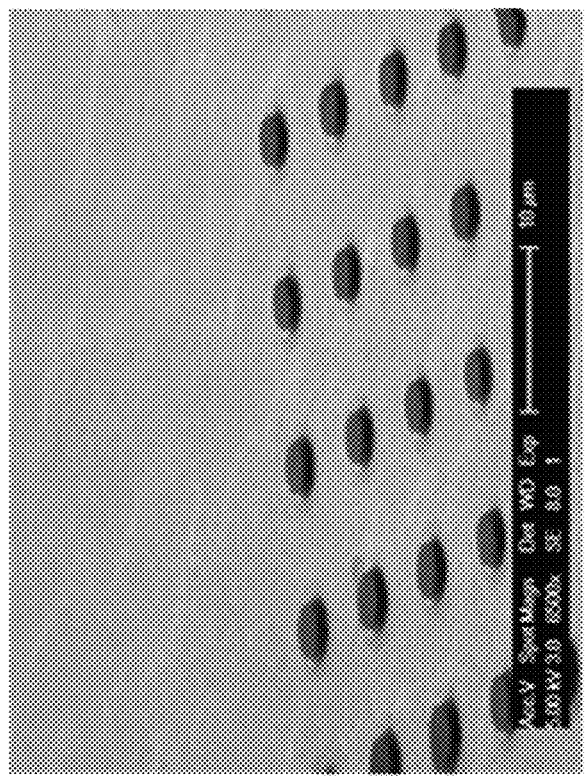
FIGS. 10A-10B. Scanning Electron Microscope (SEM) images of the dielectric ($SiO_2$) pattern on the surface of the p-GaN at different magnifications.
Figure 10A:
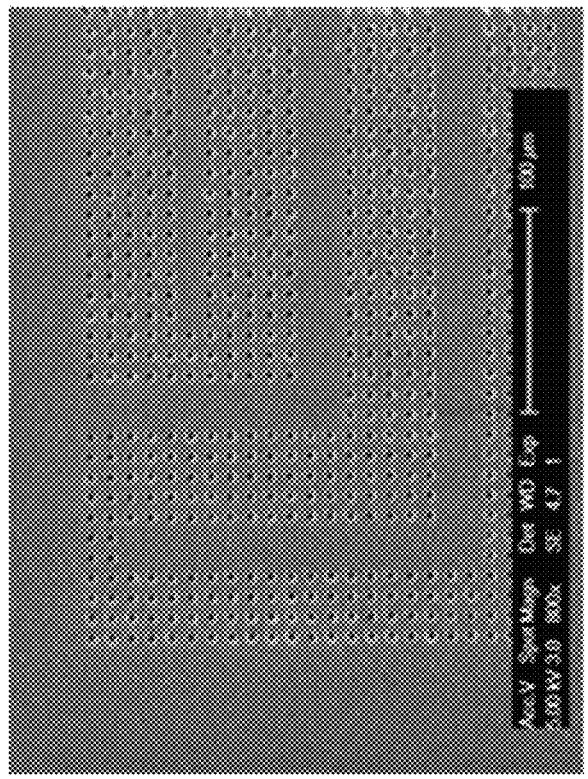
Figure 11B:
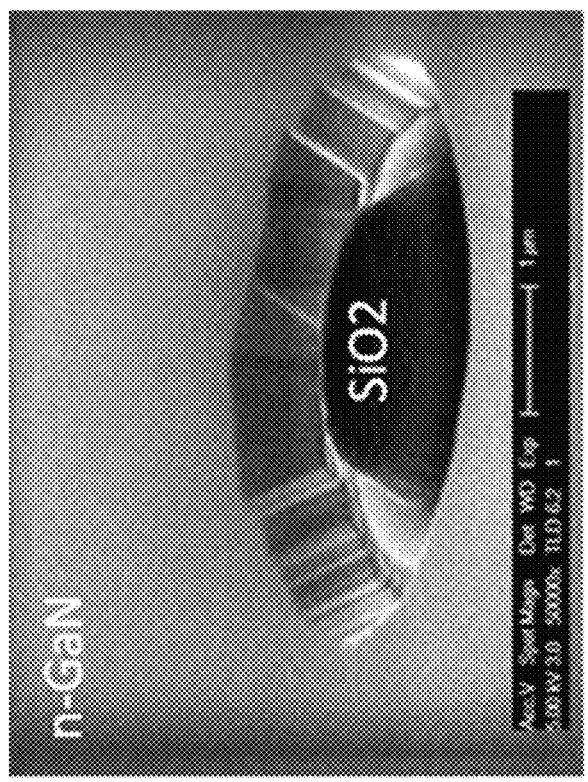
FIGS. 11A-11B. SEM images of the selective area growth tunnel junction at different magnifications.
Figure 11A:
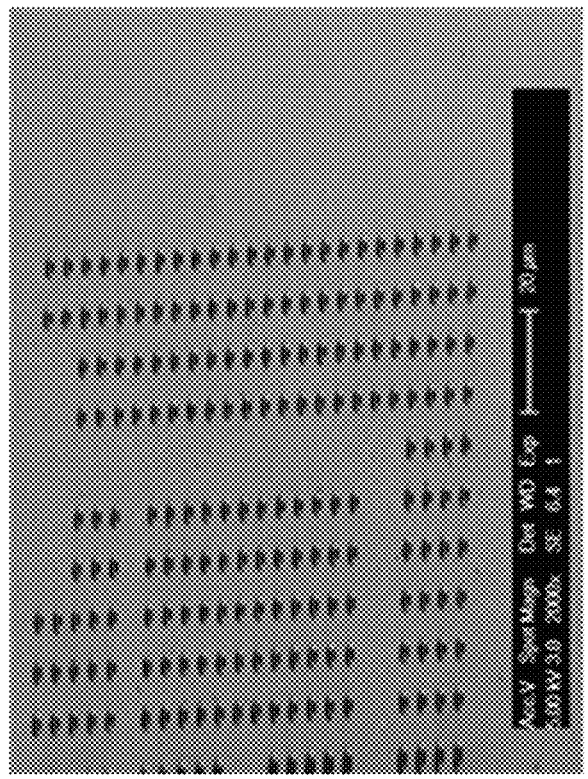

FIGS. 10A-10B show the dielectric pattern ($SiO_2$) on the p-GaN surface of the device (fabricated using method 2). The size of the dielectric pillars can be controlled by changing the mask design or choosing different photolithography chemicals. FIGS. 11A-11B show the selective area regrowth of the tunnel junction by MOCVD. The $SiO_2$ can be etched by hydrofluoric acid (wet etch) or a dry etch.

Figure 12:
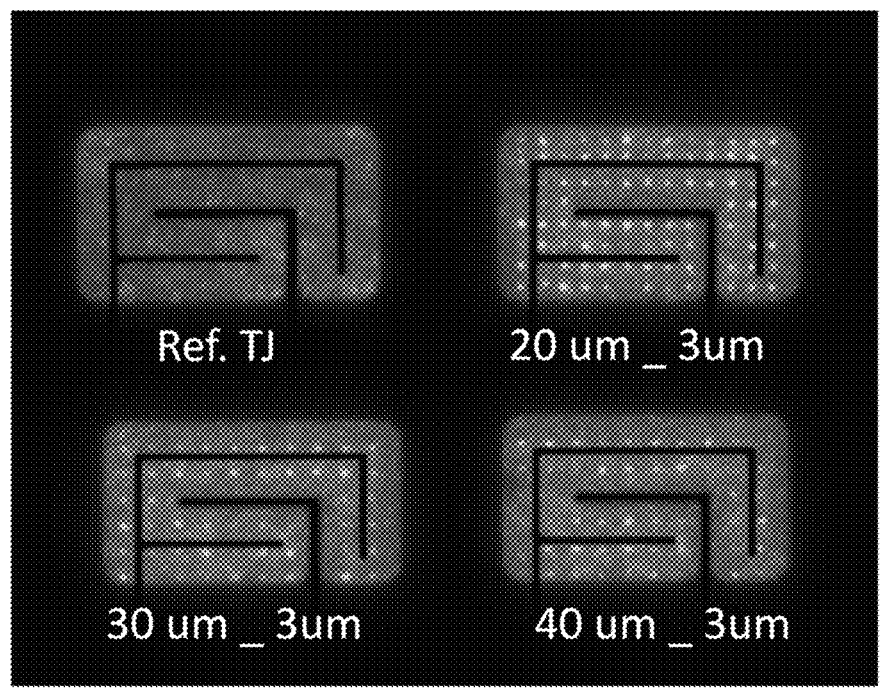
FIG. 12. An image of a blue LED with dimensions of 450 μm by 270 μm lighting up with electrical current injection.

FIG. 12 illustrates the current spreading ability of the patterned MOCVD deposited tunnel junction grown on a MOCVD LED. All LEDs with patterned the tunnel junction showed better light spreading and higher efficiency as compared to a reference LED (a reference LED (ref LED) is a tunnel junction LED without a patterned tunnel junction).

Figure 13A:
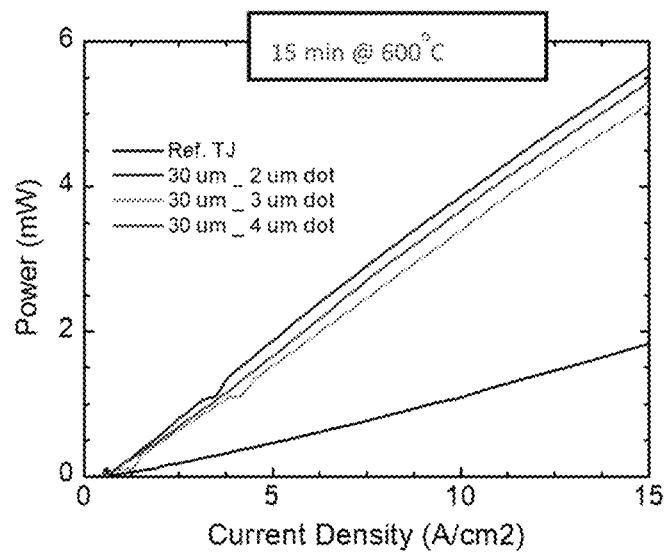
FIGS. 13A-13C. Electroluminescence measurement of the tunnel junction LED, showing light-current (L-I) curves for LEDs subjected to a reactivation anneal at 600° C. for 15 min (FIG. 13A), current-voltage (I-V) curves for the LEDs subjected to a reactivation anneal at 700° C. for 15 min (FIG. 13B) and L-I curves for the LEDs subjected to a reactivation anneal at 700° C. for 15 min (FIG. 13C).
Figure 13B:
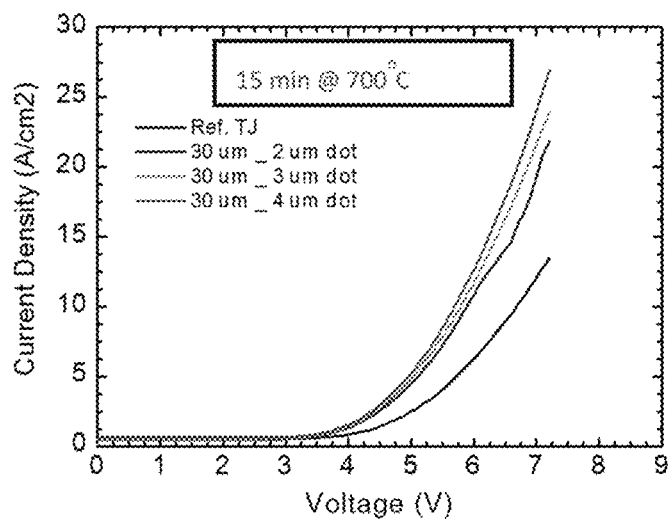
Figure 13C:
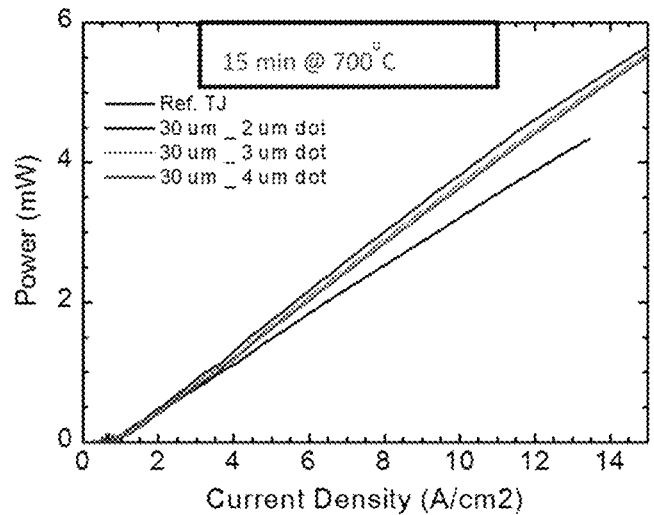

FIG. 13A shows the light-current (L-I) characteristics of several tunnel junction LEDs with different patterns and reference LEDs. The activation conditions were at 600° C. for 15 minutes. FIGS. 13B and 13C illustrate the L-I and I-V measurement of several tunnel junction LEDs fabricated using an activation condition of 700° C. for 15 min. Increasing the temperature improves the performance of the reference LEDs but has almost no effect on the tunnel junction LEDs with patterns. This means the pattern tunnel junction LEDs can be fully activated at lower temperature due to the combination of the lateral and vertical activation of the p-GaN.

3. Process Steps

Figure 14:
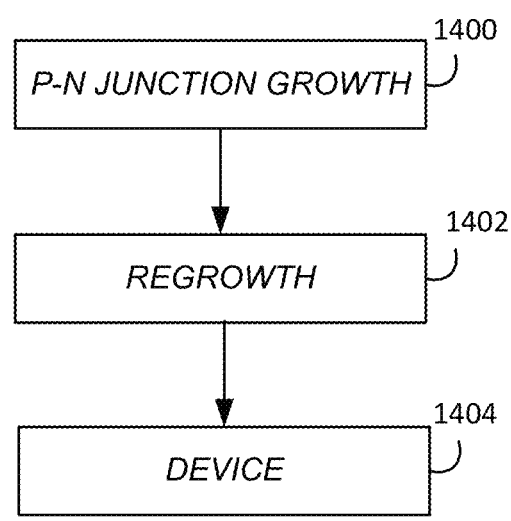
FIG. 14 is a flowchart illustrating a method of fabricating a device according to the second embodiment.

FIG. 14 is a flowchart illustrating a method for fabricating an (Al,Ga,In,B)N semiconductor device (referring also to FIGS. 8A-B and 9A-9C).

Block 1400 represents growth of a III-nitride p-n junction 804 with an active region using metal-organic chemical vapor deposition (MOCVD). The III-nitride p-n junction includes a first p-type layer 808 (e.g., gallium nitride, GaN), a first n-type layer 810 (e.g., GaN), and the active region 806 (e.g., one or more III-nitride quantum wells QW) between the first n-type layer and the first p-type layer.

The growth direction could be any plane of the III-nitride crystal that is polar, semipolar and nonpolar.

The growth could be on homoepitaxial or heteroepitaxial substrate. The substrate used could be a III-nitride native substrate such as GaN, AlN and InN or foreign substrate such as sapphire, silicon carbide and silicon.

Block 1402 represents performing a subsequent regrowth of (Al,Ga,In,B)N material or growing a subsequent III-nitride material 812 comprising a second p-type layer 818 (e.g., p-type GaN) using MOCVD, and reactivating MOCVD grown (Al,Ga,In,B)N material through lateral and vertical diffusion of hydrogen through mesa sidewalls T2 and top surface T in devices 800 with one or more lateral dimensions L that are larger than 50 μm.

In one or more embodiments, the subsequent regrowth 812 forms a tunnel junction 820.

In one or more embodiments, only the first n-type layer 810 in the p-n junction and the active region 806 are grown using MOCVD, and the first p-type layer 808, the second p-type layer 818 and the tunnel junction are grown by the technique involving chemical vapor deposition.

In one or more embodiments, the subsequent regrowth is of highly doped p-type material to reduce contact resistance.

In one or more embodiments, the subsequent regrowth ends with an n-type material between about 1 nm to about 5000 nm thick.

In one or more embodiments, the subsequent regrowth includes n-type and p-type material, and the tunnel junction 820 is formed at a regrowth interface 814a of the n-type and p-type material.

In one or more embodiments, delta-doping is used at the regrowth interface 814a between the p-n junction and the subsequent III-nitride material 812.

In one or more embodiments, the subsequent regrowth is performed using group III element metalorganic vapor precursors.

In one or more embodiments, the subsequent regrowth is performed using vapor phase Si or Ge precursors.

In one or more embodiments, the subsequent III-nitride material forms layers of III-nitride material 812 and the magnesium (Mg) concentration in the layers of the III-nitride material are suppressed through exposure to an acid or through flow modulation epitaxy.

The step of Block 1402 can further comprise forming the mesa 802 in the III-nitride p-n junction 804 and the subsequent III-nitride material 812, wherein the mesa has one or more lateral dimensions L that are larger than 50 µm; and reactivating or activating a second p-type layer 818 in the subsequent III-nitride material through lateral and vertical diffusion of hydrogen through the mesa's sidewalls T2 and top surface T.

In one or more embodiments, the reactivating or activating activates Mg through a lateral and vertical diffusion of hydrogen through the sidewalls T2 and top surface T of a mesa structure at elevated temperatures (e.g., above 800 degrees Celsius).

In one or more embodiments, the reactivating/activating is through the top surface and can occur through small openings that expose a surface of the second p-type layer 818 (e.g., comprising the p-GaN). The small opening can be formed before (method 1) or after (method 2) the tunnel junction subsequent regrowth. In one or more examples, the opening size is between about 0.1 µm to about 100 µm wide and a spacing between each of the openings is about 0.5 µm to about 400 µm. The small openings can be formed before the tunnel junction regrowth or subsequent growth of III-nitride material 812 by depositing first a pattern P of a dielectric 826 on a surface 860 of the first p-type layer 808 (e.g., p-GaN surface) such that the subsequent growth 812 will occur selectively on the exposed area A of the first p-type layer 808 (e.g., p-GaN surface) only.

The dielectric could be silicon dioxide $SiO_2$, silicon nitride $SiN_x$, or titanium nitride, for example.

The dielectric could be deposited by Ion bean deposition tool (IBD), plasma-enhanced chemical vapor deposition (PECVD), using sputtering tools, or by thermal evaporation, for example.

In one or more examples, the spacing between each opening is between about 0.5 µm to about 400 µm. The opening shape could be any geometric shape, and the pattern of the openings can be any geometric shape.

The openings can be formed after the subsequent tunnel junction regrowth such that a dry etch or wet etch will be used to create openings.

Block 1404 represents further processing steps (e.g, metal contact formation) as required to form a device 800 (e.g., as illustrated in FIGS. 8A-8B and 9A-9C) including but not limited to, a light emitting diode, laser diode, or a light absorber such as a solar cell or photodetector. In one or more embodiments, the device is a light-emitting diode (LED), and sheet resistance on both sides of the LED's p-n junction is matched to reduce current crowding.

In one or more examples, a single metal contact deposition is used to fabricate contacts to both n-type layers of the device.

In one or more examples, the method of embodiments 1 and 2 can be combined. In one or more examples, the delta doping and pattern of III-nitride regions can be such that a current density of at least 5 $A/cm^2$ flows in response to a voltage of 2.5 V applied across the device between a first metal contact to the first n-type layer and a second metal contact to the second n-type layer (FIG. 5), and the device outputs light with a power of at least 0.5 mW in response to a current density of 2.25 $A/cm^2$ flowing between the first metal contact and the second metal contact (FIG. 13C).

4. Advantages and Improvements

The present disclosure reports on the unexpected and surprising discovery that once the mesa structure is defined including a patterned tunnel junction layer on top of p-GaN, the p-GaN can be fully activated while being buried beneath the n-GaN using the exposed mesa sidewalls and the exposed top surface from the pattern mask. Effective re-activation of the p-GaN films in large devices can occur using the mesa sidewalls and the exposed p-GaN top surface formed using the patterned tunnel junction. In other MOCVD tunnel junction device designs, the re-activation process of the p-GaN can only occur from the exposed sidewalls, which makes the re-activation very inefficient for large size devices. If the lateral dimensions of the device are larger than the diffusion length of hydrogen when it is released from the H—Mg complex during the reactivation anneal, large area devices cannot be fully activated from the sidewall only.

C. Nomenclature

This invention relates to III-nitride optoelectronic devices with tunnel junction n-type doped layers. The term "III-nitrides" or "III-N" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$. Optoelectronic devices include, but are not limited to, light-emitting diodes (LEDs), vertical cavity surface emitting lasers (VCSELs), edge-emitting laser diodes (EELDs), and solar cells. Furthermore, III-nitride materials can include various polarities of (Ga,Al,In,B)N, such as Ga-polar, N-polar, semi-polar or non-polar. In particular, N-face material may be obtained from N-polar or semi-polar Gallium Nitride (GaN).

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

REFERENCES

The following references are incorporated by reference herein.

[1] Y. Ohba and A. Hatano, "A study on strong memory effects for Mg doping in GaN metalorganic chemical vapor deposition," *ELSEVIER J. Cryst. Growth*, vol. 145, pp. 214-218, 1994.

[2] H. Xing, D. S. Green, H. Yu, T. Mates, P. Kozodoy, S. Keller, S. P. DenBaars, and U. K. Mishra, "Memory Effect and Redistribution of Mg into Sequentially Regrown GaN Layer by Metalorganic Chemical Vapor Deposition," *Jpn. J. Appl. Phys.*, vol. 42, no. Part 1, No. 1, pp. 50-53, January 2003.

[3] G. B. Stringfellow, "Overview of the OMVPE Process," in *Organometallic Vapor-Phase Epitaxy*, 2nd ed., San Diego: Elsevier, 1999, pp. 1-16.

[4] S. Nakamura, N. Iwasa, M. Senoh, and T. Mukai, "Hole Compensation Mechanism of P-Type GaN Films," *Jpn. J. Appl. Phys.*, vol. 31, no. Part 1, No. 5A, pp. 1258-1266, May 1992.

[5] B. P. Yonkee, E. C. Young, C. Lee, J. T. Leonard, S. P. DenBaars, J. S. Speck, and S. Nakamura, "Demonstration of a III-nitride edge-emitting laser diode utilizing a GaN tunnel junction contact," *Opt. Express*, vol. 24, no. 7, p. 7816, April 2016.

[6] B. P. Yonkee, R. M. Farrell, J. T. Leonard, S. P. DenBaars, J. S. Speck, and S. Nakamura, "Demonstration of low resistance ohmic contacts to p-type (2021T) GaN," *Semicond. Sci. Technol.*, vol. 30, no. 7, p. 75007, 2015.

[7] E. C. Young, B. P. Yonkee, F. Wu, S. H. Oh, S. P. DenBaars, S. Nakamura, and J. S. Speck, "Hybrid tunnel junction contacts to III-nitride light-emitting diodes," *Appl. Phys. Express*, vol. 9, no. 2, p. 22102, February 2016.

[8] T. Takeuchi, G. Hasnain, S. Corzine, M. Hueschen, R. P. Schneider, Jr., C. Kocot, M. Blomqvist, Y. Chang, D. Lefforge, M. R. Krames, L. W. Cook, S. A. Stockman, R. P. Schneider, C. Kocot, M. Blomqvist, Y. Chang, D. Lefforge, M. R. Krames, L. W. Cook, and S. A. Stockman, "GaN-based light emitting diodes with tunnel junctions," *Japanese J. Appl. Phys./Part 2*, vol. 40, no. 8B, pp. L861-L863, 2001.

[9] J. Seong-Ran, S. Young-Ho, J. Ho-Jin, Y. Gye Mo, H. Soon Won, S. J. Son, S. R. Jeon, Y. H. Song, H. J. Jang, G. M. Yang, S. W. Hwang, and S. J. Son, "Lateral current spreading in GaN-based light-emitting diodes utilizing tunnel contact junctions," *Appl. Phys. Lett.*, vol. 78, no. 21, pp. 3265-3267, 2001.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a semiconductor device, comprising:
    growing a III-nitride p-n junction with an active region using metal-organic chemical vapor deposition (MOCVD) and/or chemical vapor deposition (CVD), wherein the III-nitride p-n junction includes a first p-type layer, a first n-type layer, and the active region between the first n-type layer and the first p-type layer;
    growing a subsequent III-nitride material comprising a second p-type layer and a second n-type layer using MOCVD or CVD;
    forming a mesa in the III-nitride p-n junction and the subsequent III-nitride material, wherein the mesa has one or more lateral dimensions that are larger than 5 µm;
    patterning an array of openings in the subsequent III-nitride material exposing the second p-type layer on a top surface of the mesa;
    reactivating or activating a second p-type layer in the subsequent III-nitride material through lateral and vertical diffusion of hydrogen through the mesa's sidewalls and top surface; and
    forming a first metal contact to the first n-type layer and a second metal contact to the second n-type layer, wherein:
    the subsequent III-nitride material forms a tunnel junction at an interface between the second n-type layer and the second p-type layer,
    the device comprises a light emitting device outputting light having a power of at least 3 mW in response to a current density of at least 10 A/cm$^2$-flowing between the first metal contact and the second metal contact, and
    the current density of at least 5 A/cm$^2$ flows in response to a voltage of less than 3.5 V applied across the device between the first metal contact and the second metal contact.

2. The method of claim 1, wherein the subsequent III-nitride material forms layers of III-nitride material and a magnesium (Mg) concentration in the layers of the III-nitride material is suppressed through exposure to an acid or through flow modulation epitaxy.

3. The method of claim 1, wherein the reactivating or the activating activates magnesium (Mg) through the lateral and vertical diffusion of hydrogen through the sidewalls and the top surface at an elevated temperature above 800 degrees Celsius.

4. The method of claim 1, wherein the first n-type layer in the p-n junction and the active region are grown using the MOCVD, and the first p-type layer, the second p-type layer, and the tunnel junction are grown using the CVD.

5. The method of claim 1, wherein the one or more lateral dimensions L are 5 micrometers<L≤50 micrometers.

6. The method of claim 1, wherein the activating or the reactivating through the top surface occurs through the openings that expose a surface of the second p-type layer comprising a p-type GaN layer.

7. The method of claim 6, wherein the first p-type layer and the second p-type layer comprise p-GaN and the openings are formed before the subsequent III-nitride material including the tunnel junction by first depositing a pattern of a dielectric on a surface of the first p-GaN layer such that the subsequent III-nitride material occurs selectively only on the exposed area of the first p-type layer.

8. The method of claim 6, wherein a width of the openings is between about 0.1 µm to about 100 µm wide and a spacing between each of the openings is about 0.5 µm to about 400 µm.

9. The method of claim 1, wherein delta-doping is used at a regrowth interface between the III-nitride p-n junction and the subsequent III-nitride material.

10. The method of claim 9, wherein the delta doping comprises a pulsed delta n-type doping scheme used at a regrowth interface of the subsequent III-nitride material with the p-n junction or for the entire growth of the subsequent III-nitride material including the tunnel junction.

11. The method of claim 10, wherein the pulsed delta n-type doping scheme is achieved by injecting a precursor containing n-type dopant for 40 seconds or less per cycle and forms a continuous layer growth by keeping the precursors comprising Group V and Group III precursors uninterrupted.

12. The method of claim 10, wherein the pulsed delta n-type doping scheme is achieved by injecting precursors containing n-type dopant and Group V/III materials for a period of time in cycles.

13. A device, comprising:
a mesa including:
- a III-nitride p-n junction, the p-n junction including an active region between a first p-type layer and a first n-type layer; and
- a III-nitride region patterned on the III-nitride p-n junction, the III-nitride region including a second n-type layer, a second p-type layer, and a tunnel junction formed at an interface between the second n-type layer and the second p-type layer;
- an array of openings in the III-nitride region exposing the second p-type layer on a top surface of the mesa; and wherein the mesa has one or more lateral dimensions that are larger than 5 µm; and a first metal contact to the first n-type layer and a second metal contact to the second n-type layer, wherein:

the device comprises a light emitting device outputting light with a power of at least 3 mW in response to a current density of at least 10 A/cm$^2$ flowing between the first metal contact and the second metal contact, and the current density of at least 5 A/cm$^2$ flows in response to a voltage of less than 3.5 V applied across the device between the first metal contact and the second metal contact.

14. The device of claim 13, wherein the second n-type layer comprises a pulsed delta n-type doping scheme to realize an abrupt, smoother surface of the second-n-type layer and a higher carrier concentration in the second n-type layer.

15. The device of claim 13, further comprising a patterned dielectric on a top surface of the mesa, wherein the patterned dielectric comprises the openings exposing the second p-type layer.

16. The device of claim 13, wherein the second n-type layer comprises an n-type GaN layer having an n-type dopant concentration of at least 1.1E20 cm$^{-3}$.

17. The device of claim 13, wherein the first p-type layer, the second p-type layer, the first n-type layer, and the second n-type layer comprise GaN.

18. The device of claim 13, wherein the interface has a surface roughness of 2.2 nm or less over an area of 5 micrometers by 5 micrometers.

19. The device of claim 13, wherein the one or more lateral dimensions L are 5 micrometers<L≤50 micrometers.

20. The device of claim 13, wherein each of the openings have a width W and 0.1 µm≤W≤100 µm.

21. The device of claim 13, wherein a spacing S between the openings is 0.5 µm≤S≤400 µm.

* * * * *